(12) United States Patent
Wu et al.

(10) Patent No.: US 12,557,489 B2
(45) Date of Patent: Feb. 17, 2026

(54) DISPLAY PANEL AND MANUFACTURING METHOD THEREOF

(71) Applicants: CHANGSHA HKC OPTOELECTRONICS CO., LTD., Changsha (CN); HKC CORPORATION LIMITED, Shenzhen (CN)

(72) Inventors: Kerong Wu, Changsha (CN); Haoxuan Zheng, Changsha (CN)

(73) Assignees: CHANGSHA HKC OPTOELECTRONICS CO., LTD., Changsha (CN); HKC CORPORATION LIMITED, Shenzhen (CN)

( * ) Notice: Subject to any disclaimer, the term of this patent is extended or adjusted under 35 U.S.C. 154(b) by 456 days.

(21) Appl. No.: 18/066,475

(22) Filed: Dec. 15, 2022

(65) Prior Publication Data
US 2023/0240102 A1    Jul. 27, 2023

(30) Foreign Application Priority Data
Jan. 27, 2022  (CN) .......................... 202210102689.3

(51) Int. Cl.
*H10K 59/126* (2023.01)
*H10K 59/12* (2023.01)
*H10K 71/00* (2023.01)
*H10D 86/40* (2025.01)
(Continued)

(52) U.S. Cl.
CPC ........... *H10K 59/126* (2023.02); *H10K 71/00* (2023.02); *H10D 86/481* (2025.01); *H10D 86/60* (2025.01); *H10K 59/1201* (2023.02); *H10K 59/1213* (2023.02); *H10K 59/1216* (2023.02)

(58) Field of Classification Search
CPC ............... H10K 50/126; H10K 59/121; H10K 59/1213; H10K 59/1216
See application file for complete search history.

(56) References Cited

U.S. PATENT DOCUMENTS

| 2017/0125506 A1* | 5/2017 | Kim ...................... H10K 59/126 |
| 2017/0221976 A1* | 8/2017 | Park ..................... H10K 59/121 |
| 2017/0229531 A1* | 8/2017 | Shi ......................... H10K 50/81 |

(Continued)

FOREIGN PATENT DOCUMENTS

| CN | 107039491 | 8/2017 |
| CN | 109728000 | 5/2019 |

(Continued)

OTHER PUBLICATIONS

CNIPA, First Office Action for CN Application No. 202210102689.3, Aug. 23, 2022.

(Continued)

*Primary Examiner* — Bumsuk Won
(74) *Attorney, Agent, or Firm* — Hodgson Russ LLP (57) ABSTRACT

The display panel includes a transparent substrate and a transistor and a storage capacitor formed on the transparent substrate. The transparent substrate has a light-emitting region and a light-transmitting region. The transistor and the storage capacitor are arranged in a thickness direction of the display panel. The transistor and the storage capacitor are formed on the light-emitting region without overlapping with the light-transmitting region.

9 Claims, 6 Drawing Sheets

(51) Int. Cl.
*H10D 86/60* (2025.01)
*H10K 59/121* (2023.01)

(56) References Cited

U.S. PATENT DOCUMENTS

| | | | | |
|---|---|---|---|---|
| 2018/0122888 A1* | 5/2018 | Jung | ................ | H10K 59/1213 |
| 2021/0249499 A1* | 8/2021 | Jeon | ................ | H10D 86/0231 |
| 2022/0310732 A1* | 9/2022 | Chen | ................ | H10K 59/1216 |

FOREIGN PATENT DOCUMENTS

| | | | | | |
|---|---|---|---|---|---|
| CN | 110571245 | | 12/2019 | | |
| CN | 110824797 | | 2/2020 | | |
| CN | 110824797 A | * | 2/2020 | ......... | G02F 1/13306 |
| CN | 111584577 | | 8/2020 | | |
| CN | 113629121 | | 11/2021 | | |
| KR | 20160043327 | | 4/2016 | | |
| KR | 20180062207 | | 6/2018 | | |
| WO | 2021227106 | | 11/2021 | | |

OTHER PUBLICATIONS

GPTO, Office Action for DE Application No. 10 2022 132 510.5, Oct. 28, 2025.

\* cited by examiner

DISPLAY PANEL AND MANUFACTURING METHOD THEREOF

CROSS-REFERENCE TO RELATED APPLICATION

This application claims priority to Chinese Patent Application No. 202210102689.3, filed Jan. 27, 2022, the entire disclosure of which is incorporated herein by reference.

FIELD OF TECHNOLOGY

The disclosure belongs to the field of display, particularly relates to a display panel and a manufacturing method thereof.

BACKGROUND

A transparent display panel is a display panel that has a degree of light penetration in itself. The transparent display panel includes a light-emitting region and a light-transmitting region. An important index that determines the performance of transparent display panel is the area ratio of light-transmitting region to light-emitting region. However, at present, storage capacitors and transistors are arranged in the length or width direction of display panel, occupying a large area of light-emitting region, thus squeezing the area of light-transmitting region.

SUMMARY

There are provided a display panel and a manufacturing method thereof according to embodiments of the present disclosure. The technical solution is as below:

According to a first aspect of embodiments of the present disclosure, there is provided a display panel, which includes a transparent substrate has a light-emitting region and a light-transmitting region; and
  a transistor and a storage capacitor formed on the transparent substrate, the transistor and the storage capacitor are arranged in a thickness direction of the display panel,
  wherein the transistor and the storage capacitor are formed on the light-emitting region without overlapping with the light-transmitting region.

According to a second aspect of embodiments of the present disclosure, there is provided a manufacturing method of a display panel, the manufacturing method includes: providing a transparent substrate having a light-emitting region and a light-transmitting region; and forming a transistor and a storage capacitor on the transparent substrate; wherein the transistor and the storage capacitor are arranged in a thickness direction of the display panel,
  wherein the transistor and the storage capacitor located the light-emitting region without overlapping with the light-transmitting region.

It should be understood that the above general description and the following detailed description are exemplary and explanatory only and are not intended to limit the present disclosure.

BRIEF DESCRIPTION OF THE DRAWINGS

The accompanying drawings which are incorporated in and constitute a part of the description illustrate embodiments consistent with the disclosure and together with the description serve to explain the principles of the disclosure. It will be apparent that the drawings described below are only some embodiments of the present disclosure, and other drawings may be obtained from them without creative effort for those of ordinary skill in the art.

DETAILED DESCRIPTION OF THE EMBODIMENTS

Exemplary embodiments will now be described more comprehensively with reference to the accompanying drawings. However, the exemplary embodiments can be implemented in a variety of forms and should not be construed as being limited to the examples set forth herein. Rather, these embodiments are provided so that the present disclosure will be more comprehensive and complete, and the concept of exemplary embodiments will be fully communicated to those skilled in the art.

In this disclosure, unless otherwise stated, the term "co-layered" is used to indicate that two layers, components, members, elements, or portions may be formed by the same patterning process and that the two layers, components, members, elements, or portions are generally formed of the same material.

In the present disclosure, the terms "first", "second" are used for descriptive purposes only and are not to be construed as indicating or implying relative importance or as implying the number of technical features indicated. Thus, the features defined as "first" or "second" may be explicitly or implicitly defined as including one or more of the features. In the description of the present disclosure, "a plurality of" means two or more, unless explicitly and specifically defined otherwise.

Further, the described features, structures or characteristics may be incorporated in any suitable manner in one or more embodiments. In the following description, many specific details are provided to give a full understanding of the embodiments of the present disclosure. However, those skilled in the art will appreciate that one or more of the technical solutions of the present disclosure may be practiced without particular details, or other methods, group elements, devices, steps, etc. may be employed. In other instances, well-known methods, devices, implementations or operations are not shown or described in detail to avoid obscuring aspects of the present disclosure.

Embodiment 1

Figure 1:
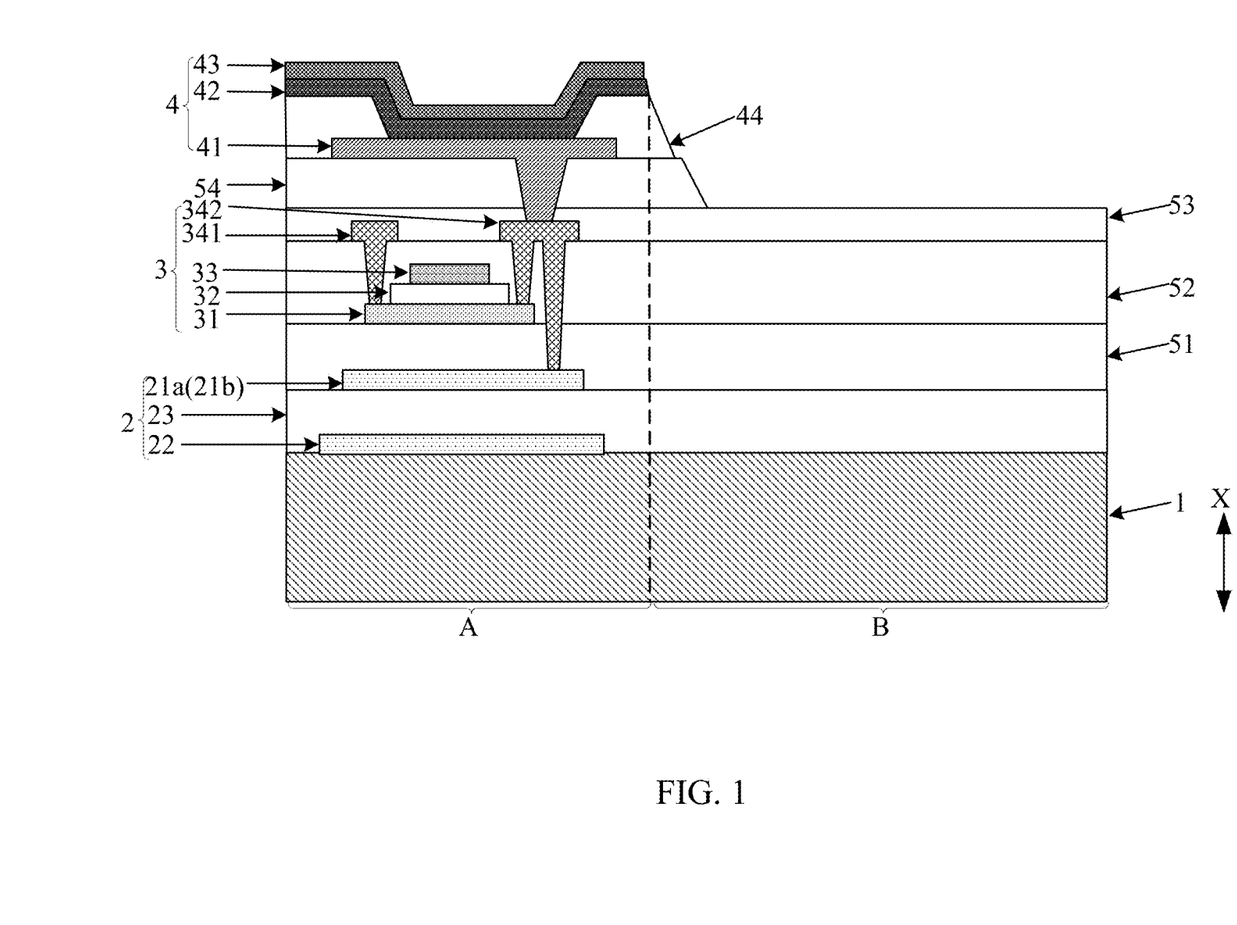
FIG. 1 shows a schematic diagram of a first display panel according to embodiment 1 of the present disclosure.
Figure 2:
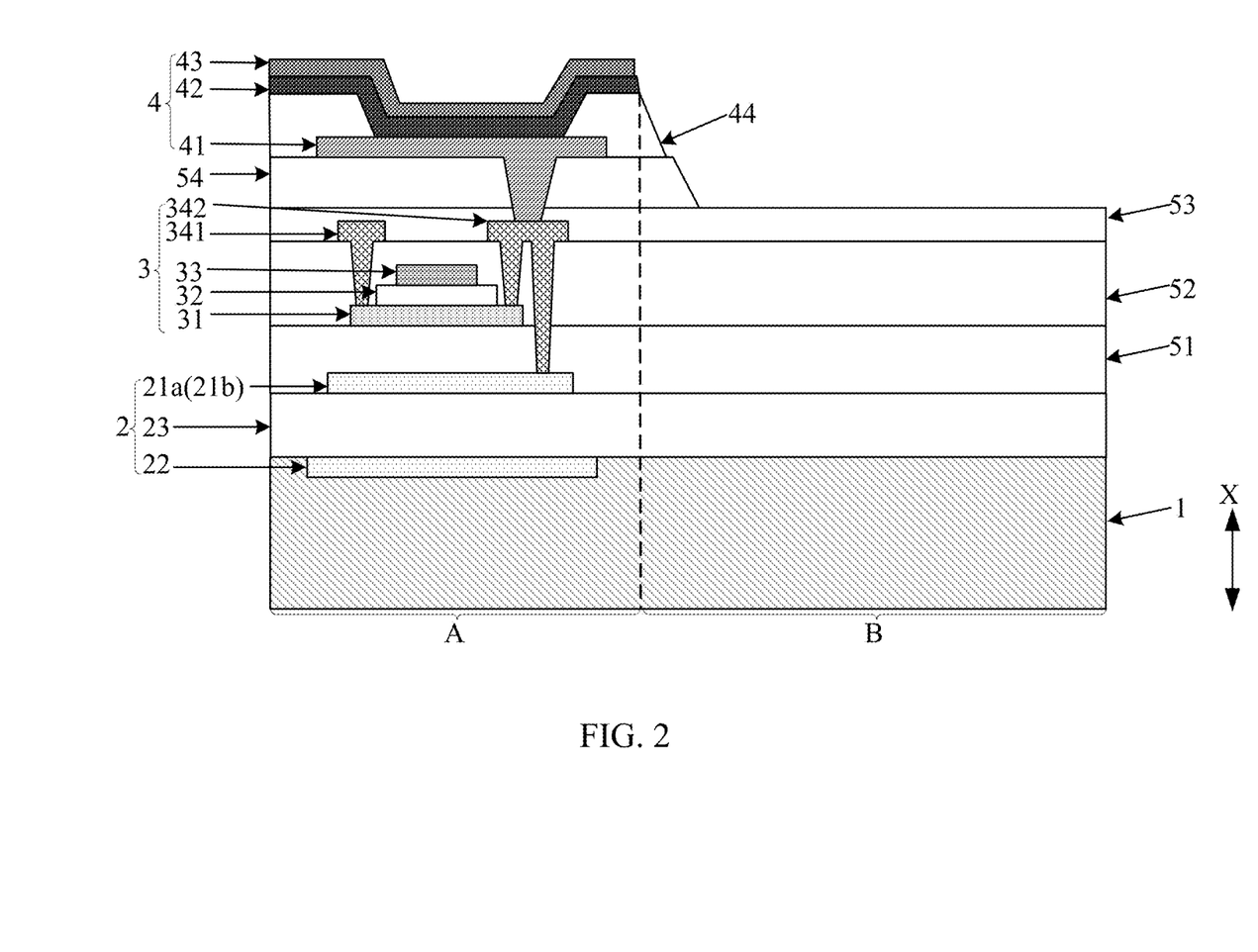
FIG. 2 shows a schematic diagram of a second display panel according to embodiment 1 of the present disclosure.
Figure 3:
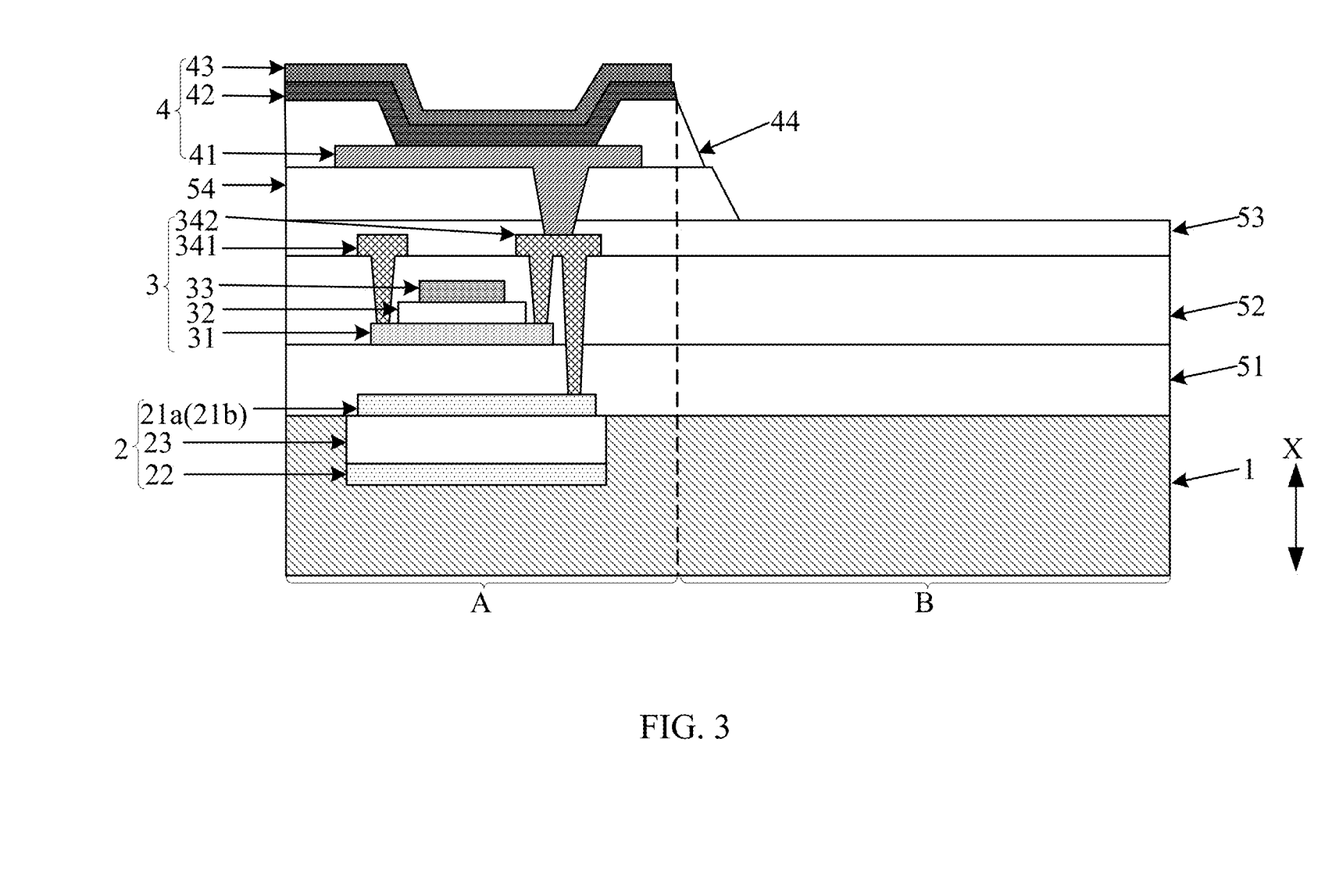
FIG. 3 shows a schematic diagram of a third display panel according to embodiment 1 of the present disclosure.

As shown in FIGS. 1-3, the embodiment of the present disclosure provides of a display panel, which includes a transparent substrate 1 and a transistor 3 and a storage capacitor 2 formed on the transparent substrate 1. The transparent substrate 1 is provided with a light-emitting region A and a light-transmitting region B.

It is worth noting that the light-emitting region A and the light-transmitting region B are pre-divided regions on the transparent substrate 1, and then a light-emitting device 4 will be formed on the light-emitting region A, and a cathode and other structures of the light-emitting device 4 are opaque metal structures so that external natural light cannot penetrate the light-emitting device 4 in the light-emitting region A. A transparent structure is formed on the light-transmitting region B, so that external natural light can pass through the light-transmitting region B. The light-emitting region A and the light-transmitting region B can also be understood as the light-emitting region and the light-transmitting region of the display panel.

It can be understood that the structures of the gate 33, the source 342, the drain 341 of the transistor 3 and the electrode plate of the storage capacitor 2 are generally opaque metal structures. Therefore, the smaller a total area of the transistor 3 and the storage capacitor 2 on the transparent substrate 1, the larger an area of the light-transmitting region B.

In this embodiment, the transistor 3 and the storage capacitor 2 are arranged in a thickness direction X of the display panel. The transistor 3 and the storage capacitor 2 are formed on the light-emitting region A and do not overlap with the light-transmitting region B. That is to say, the transistor 3 and the storage capacitor 2 are stacked on the transparent substrate 1 and occupy a position of the light-emitting region A which is not completely transparent. Therefore, the present solution can reduce the area occupied by the opaque structure on the transparent substrate 1, thereby facilitating the enlargement of the area of the light-transmitting region B to improve the light transmittance of the display panel.

In this embodiment, the transistor 3 is of a top gate type. The transistor 3 may include an active layer 31, a gate insulating layer 32, a gate 33, a source 342 and a drain 341. Specifically, the active layer 31 may be formed on the buffer layer 51, the gate insulating layer 32 covers the active layer 31, and the gate 33 is formed on a side of the gate insulating layer 32 facing away from the active layer 31. The transistor 3 may also include an interlayer dielectric layer 52 for isolating the conductive structures, specifically covering the gate 33, the gate insulating layer 32, and the active layer 31. The source 342 and the drain 341 are formed on a side of the interlayer dielectric layer 52 facing away from the transparent substrate 1 and on opposite sides of the gate 33, respectively, and can be contacted with opposite sides of the active layer 31 through vias (e.g., a metal via), respectively. The interlayer dielectric layer 52 also covers the vias. It should be understood that the transistor can 3 also be of a bottom gate type.

For example, the material of the gate 33 may include metallic or alloy materials, including, for example, molybdenum, aluminum and titanium. The source 342 and the drain 341 may include metallic or alloy materials, such as a metallic monolayer or multilayer structure formed by molybdenum, aluminum and titanium, etc. For example, the multi-layer structure is a multi-metal layer stack, such as a titanium, aluminum, titanium three-layer metal stack (Ti/Al/Ti), etc. The material of the active layer 31 may be an oxide, for example, a metal oxide material such as IGZO (Indium Gallium Zinc Oxide), which has high precision, high electron mobility, low power consumption and high touch performance, may be adopted. The material of the interlayer dielectric layer 52 and the buffer layer 51 is an insulating material such as silicon oxide, silicon nitride or silicon oxynitride.

The display panel further includes a light-shielding layer 21a formed between the transistor 3 and the transparent substrate 1 and shielding the active layer 31 of the transistor 3. The active layer 31 of the transistor 3 is located on a side of the gate 33 of the transistor close to the light-shielding layer 21a and is insulated from the light-shielding layer 21a. Thus, the light-shielding layer 21a can reduce the influence of light on the active layer 31, thereby improving the electrical performance and stability of the transistor 3.

In this embodiment, the storage capacitor 2 includes a first electrode plate 21b which is composed of the light-shielding layer 21a. The second electrode plate 22 is located on a side of the first electrode plate 21b away from the active layer 31, and a dielectric layer 23 is disposed between the second electrode plate 22 and the first electrode plate 21b. That is, the light-shielding layer 21a is used not only for shielding the active layer 31 but also for constituting the first electrode plate 21b of the storage capacitor 2.

In this embodiment, since the light-shielding layer 21a is used as the first electrode plate 21b, it is beneficial to simplify the internal structure of the display panel and further reduce the thickness of the display panel. In addition, it is possible to shorten the process time and reduce the production cost.

Further, either of the source and the drain of the transistor 3 penetrates the insulating layer between the source or the drain and the light-shielding layer 21a and is connected to the light-shielding layer 21a. For example, the source 342 penetrates the interlayer dielectric layer 52 and the buffer layer 51 and is connected to the light-shielding layer 21a, i.e., the insulating layer may be composed of the interlayer dielectric layer 52 and the buffer layer 51.

In this embodiment, an area of the second electrode plate 22 may be larger than that of the first electrode plate 21b. By making the area of the second electrode plate 22 larger, the mask alignment can be facilitated and the influence of an alignment error between the first electrode plate 21b and the second electrode plate 22 on the performance of the storage capacitor 2 can be reduced. In other examples, the area of the first electrode plate 21b may also be equal to the area of the second electrode plate 22. Further, the foregoing "area of the second plate 22" can be understood as an area of the second plate 22 facing the surface of the first plate 21b, and "area of the first plate 21b" can be understood as an area of the first plate 21b facing the surface of the second plate 22.

The specific position of the second electrode plate 22 will be explained by example below.

In example 1, as shown in FIG. 1, the second electrode plate 22 protrudes from an upper surface of the transparent substrate 1. That is, the second electrode plate 22, the dielectric layer 23 and the first electrode plate 21b may be formed directly on the transparent substrate 1 in sequence. Therefore, the process steps are less and the production time is shorter.

In example 2, as shown in FIG. 2, the second electrode plate 22 is positioned within the transparent substrate 1, and an upper surface of the second electrode plate 22 is flush with the upper surface of the transparent substrate 1. Therefore, the second electrode plate 22 may not occupy an additional space of the display panel, thereby reducing the thickness of the display panel.

In example 3, as shown in FIG. 3, the second electrode plate 22 and the dielectric layer 23 are located within the transparent substrate 1, and an upper surface of the dielectric layer 23 is flush with an upper surface of the transparent substrate 1. Therefore, the second electrode plate 22 and the dielectric layer 23 may not occupy an additional space of the display panel, thereby reducing the thickness of the display panel.

In other examples, the first electrode plate 21b, the second electrode plate 22 and the dielectric layer 23 may all be located within the transparent substrate 1. Thus, the thickness of the display panel can be reduced to a greater extent while ensuring that the light-transmitting region B has a large area.

The material of the second electrode plate 22 may be a metal such as aluminum, titanium, molybdenum, gold, silver or copper.

The material of the dielectric layer 23 may be an insulating material such as silicon oxide or silicon nitride. Further, in order to increase the capacity of the storage capacitor 2, an insulating material with a high dielectric constant may be used to form the dielectric layer 23 such as hafnium dioxide.

A distance between the first plate 21b and the second plate 22 may be 100 nm to 500 nm, for example, 200 nm, 300 nm or 400 nm. It should be understood that a larger storage capacity can be obtained by appropriately reducing a distance between the first electrode plate 21b and the second electrode plate 22.

An effective overlap area of the first plate 21b and the second plate 22 may be 50 um$^2$ to 300 um$^2$, for example, 100 um$^2$, 200 um$^2$ or 250 um$^2$. When the effective overlap area of the two is kept in the above range, it enables the storage capacitor 2 to have a large storage capacity and also avoids generating a large light-shielding area.

Referring to FIGS. 1-3, in this embodiment, the light-emitting device 4 is located above the transistor 3 and connected to a source 342 of the transistor 3. The light-emitting device 4 includes an anode 41, a cathode 43 and a light-emitting layer 42 therebetween. In addition, the organic light-emitting device also includes a pixel define unit 44. A portion of the pixel define unit 44 located in the light-emitting region A may have a pixel opening exposing the anode 41. In addition, the light-emitting device 4 may further include function layers such as an electron injection layer, an electron transport layer, a hole injection layer, a hole transport layer and the like in different examples depending on actual needs.

The anode 41 may be made of indium tin oxide (ITO), indium zinc oxide (IZO), zinc oxide (ZnO) and the like. The cathode 43 may be made of a metal material such as lithium (Li), aluminum (Al), magnesium (Mg), and silver (Ag). The light-emitting layer 42 may include a small molecule organic material or a polymer molecule organic material, may be a fluorescent light-emitting material or a phosphorescent light-emitting material, may emit red light, green light, blue light, may emit white light, or the like. The pixel define unit 44 may be made of an organic material such as a photoresist or the like.

A planarizing layer 54 and a first passivation layer 53 are further provided between the light-emitting device 4 and the transistor 3. The material of the first passivation layer 53 may be an inorganic material such as silicon nitride or silicon oxide. The planarizing layer 54 may be a single-layer structure or a multi-layer structure. The planarizing layer 54 may be made of an organic material such as a photoresist, an acrylic-based polymer, a silicone-based polymer or the like.

To sum up, in this embodiment, the transistor 3 and the storage capacitor 2 are arranged in a thickness direction X of the display panel, so that a total area occupied by the transistor 3 and the storage capacitor 2 on the transparent substrate 1 can be reduced, thereby improving the light transmittance. Further, using the light-shielding layer 21a as the first electrode plate 21b of the storage capacitor 2 facilitates simplification of the internal structure of the display panel.

Embodiment 2

Figure 4:
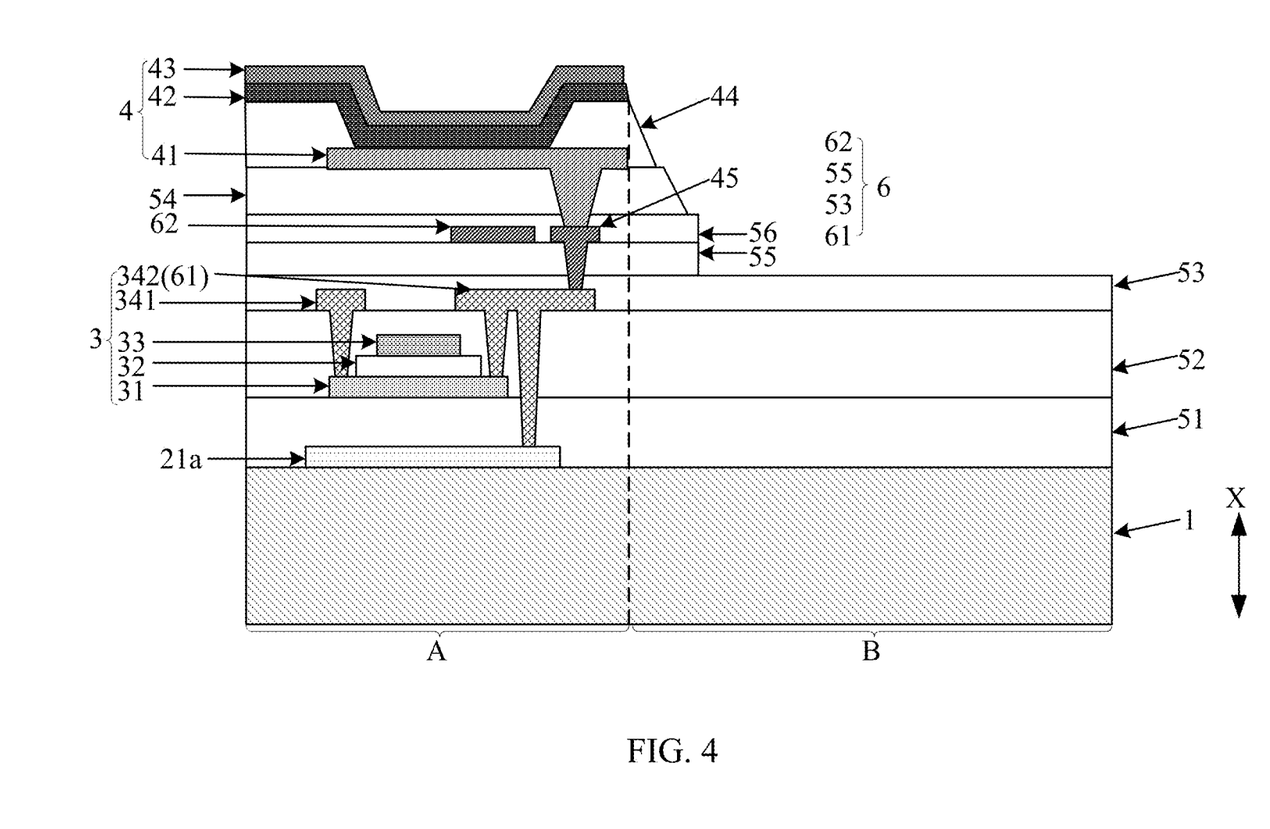
FIG. 4 shows a schematic diagram of the display panel according to embodiment 2 of the present disclosure.

As shown in FIG. 4, the embodiment of the present disclosure provides a display panel, which is different from that in embodiment 1 in that: the position of the storage capacitor 6 is different from that in embodiment 1, and in this embodiment, the source 342 and the drain 341 are arranged on the same layer as the first plate 61 of the storage capacitor 6. Please refer to the detailed description of the foregoing embodiments for the same or similar parts of this embodiment as the foregoing embodiments, which will not be repeated here. The following will be explained in detail in conjunction with the accompanying drawings.

In this embodiment, the first electrode plate 61 is arranged in the same layer as the source 342 and the drain 341 of the transistor 3, that is, the first electrode plate 61 is formed in the same patterning process as the source 342 and the drain 341, so that the production process can be simplified.

The first electrode plate 61 is connected to either of the source 342 and the drain 341. For example, the first electrode plate 61 is connected to the source 342, which can be understood as an integral structure of the first electrode plate 61 and the source 342. Thus, the internal structure of the display panel can be simplified, thereby reducing the thickness of the display panel.

The second electrode plate 62 of the storage capacitor 6 is located on the side of the first electrode plate 61 away from the transparent substrate 1, and a dielectric layer is provided between the second electrode plate 62 and the first electrode plate 61. By way of example, the dielectric layer may be constituted by the first passivation layer 53 and the second passivation layer 55. In other examples, the dielectric layer may also be constituted by a single-layer structure.

In this embodiment, the display panel may further include a via electrode 45 located between the light-emitting device 4 and the transistor 3, and either of the source 342 and the drain 341 of the transistor 3 is connected to the anode 41 of the light-emitting device 4 through the via electrode 45. Further, the anode 41 of the light-emitting device 4 may penetrate the planarizing layer 54 and a part of the third passivation layer 56 and be connected to one end of the via electrode 45, and the other end of the via electrode 45 may penetrate the second passivation layer 55 and a part of the first passivation layer 53 and be connected to the source 342 of the transistor 3.

The via electrode 45 may be a low resistance metal such as gold, silver, copper, aluminum, molybdenum or the like. The via electrode 45 can reduce the contact resistance, thereby improving the light-emitting efficiency of the light-emitting device 4.

Further, the second electrode plate 62 is arranged in the same layer as the via electrode 45 and is disconnected from each other. That is to say, they are formed in the same patterning process, so that the production efficiency can be improved. In other examples, the display panel may also have no via electrode 45, and the second plate 62 is formed by a separate patterning process.

Embodiment 3

Figure 5:
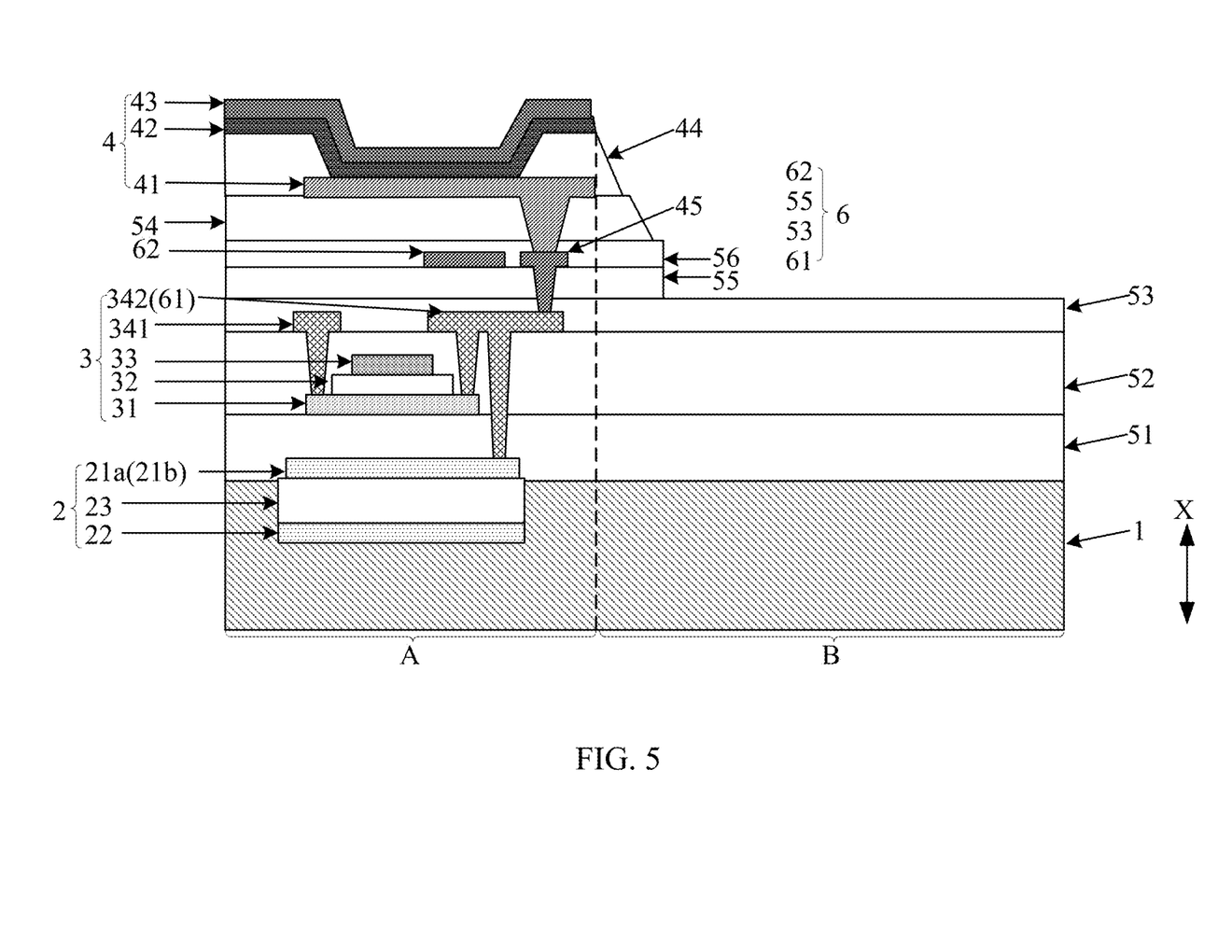
FIG. 5 shows a schematic diagram of the display panel according to embodiment 3 of the present disclosure.

As shown in FIG. 5, this embodiment provides a display panel, which is a combination of the solutions of embodiment 1 and embodiment 2. Please refer to the detailed description of the foregoing embodiments for the same or similar parts of this embodiment as the foregoing embodiments, which will not be repeated here. The following will be explained in detail in conjunction with the accompanying drawings.

In this embodiment, the display panel includes upper and lower storage capacitors. A light-shielding layer 21a and a second electrode plate 22 are used to form a storage capacitor 2. The first electrode 61 in the same layer as the source 342 and the drain 341 and the other second electrode 62 are used to constitute another storage capacitor 6. Therefore, two storage capacitors are beneficial to increase the storage capacity.

To sum up, the transistor and the storage capacitor are arranged in the thickness direction of the display panel, and the transistor and the storage capacitor are located in the light-emitting region without overlapping with the light-transmitting region to increase the area of the light-transmitting region. Therefore, the solution can reduce the area of the light-emitting region occupied by the transistor and the storage capacitor, thereby facilitating the enlargement of the area of the light-transmitting region to increase the light transmittance and improve the user experience.

Embodiment 4

As shown in FIG. 1-FIG. 6, the embodiment of the present disclosure provides a manufacturing method of a display panel, which can be used to manufacture the display panel described in embodiments 1-3. The manufacturing method includes steps S100, S110 and S120.

Figure 6:
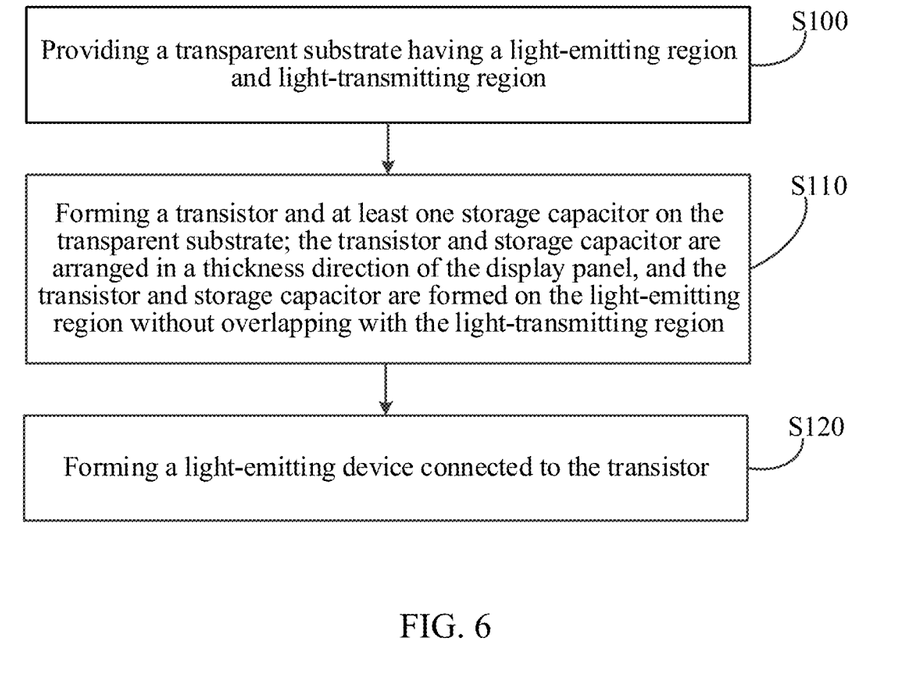
FIG. 6 shows a flowchart of a manufacturing method of the display panel according to embodiments of the present disclosure.

Each step is described in detail below.

Step S100: a transparent substrate 1 is provided.

Specifically, the transparent substrate 1 has a light-emitting region A and a light-transmitting region B.

Step S110: a storage capacitor 2 and a transistor 3 are formed on the transparent substrate 1. The transistor 3 and the storage capacitor 2 are arranged in a thickness direction X of the display panel. The transistor 3 and the storage capacitor 2 are formed on the light-emitting region A and do not overlap with the light-transmitting region B.

The step of forming the storage capacitor 2 and the transistor 3 will be described in detail below.

In example 1, as shown in FIGS. 1-3, the storage capacitor 2 is formed first, followed by the transistor 3. It is worth noting that in this example, the first electrode plate 21b of the storage capacitor 2 is constituted by the light-shielding layer 21a.

In a specific example, referring to FIG. 1, the steps of forming the storage capacitor 2 include forming the second electrode plate 22, the dielectric layer 23, and the light-shielding layer 21a sequentially on the transparent substrate 1.

The second electrode plate 22 and the light-shielding layer 21a may be formed by a physical vapor deposition method, and the dielectric layer 23 may be formed by a chemical vapor deposition method.

In another specific example, referring to FIG. 2, the step of forming the storage capacitor 2 includes removing a part of transparent substrate 1 to form a groove in the transparent substrate 1. Grooves can be formed by dry etching or wet etching.

The second electrode plate 22 filling the groove is formed, and an upper surface of the second electrode plate 22 is flush with an upper surface of transparent substrate 1.

Specifically, a second plate film may be formed by the physical vapor deposition method, and a part of the second plate film is located on the upper surface of the transparent substrate. Further, the second plate film located on the upper surface of the transparent substrate 1 can be removed, and the remaining second plate film in the groove is used to constitute the second plate.

The dielectric layer 23 and the light-shielding layer 21a are sequentially formed on the second electrode plate 22.

In another specific example, referring to FIG. 3, a part of the transparent substrate 1 is removed to form a groove within the transparent substrate 1. The second electrode plate 22 and the dielectric layer 23 are formed in sequence in the groove, and an upper surface of the dielectric layer 23 is flush with the upper surface of the transparent substrate 1. The light-shielding layer 21a is formed on the dielectric layer 23.

Further, a groove having a large depth may be formed so that the second electrode plate 22, the dielectric layer 23, and the light-shielding layer 21a are all formed in the groove, and the upper surface of the light-shielding layer 21a may be flush with the upper surface of the transparent substrate 1.

Based on this, the light-shielding layer 21a serves as the first electrode plate 21b and forms the storage capacitor 2 with the dielectric layer 23 and the second electrode plate 22.

After the storage capacitor 2 is formed, the transistor 3 is formed on the light-shielding layer 21a.

Specifically, the buffer layer 51, the active layer 31, the gate insulating layer 32, the gate 33 and the source 342 and the drain 341 are sequentially formed on the light-shielding layer 21a.

In the second example, as shown in FIG. 4, the transistor 3 is formed first followed by the storage capacitor 6.

Specifically, the transistor 3 is formed on the transparent substrate 1. The step of forming the transistor 3 can be described in detail with reference to the foregoing examples.

In forming of the source 342 of the transistor 3, the first electrode plate 61 is formed by the same patterning process. In this embodiment, the source 342 and the first electrode plate 61 may be one-piece structure.

A dielectric layer is formed on the first electrode plate 61. Specifically, the first passivation layer 53 and the second passivation layer 55 may be formed in sequence to together serve as a dielectric layer.

The second electrode plate 62 is formed on the dielectric layer, and the via electrode 45 connected to the transistor 3 is formed. The second electrode plate 62 and the via electrode 45 are formed by the same patterning process. The via electrode 45 penetrates the second passivation layer 55 and a part of the first passivation layer 53 and is connected to the source 342 of the transistor 3.

Based on this, the first electrode plate 61, the dielectric layer and the second electrode plate 62 constitute the storage capacitor 6.

It can be understood that as shown in FIG. 5, in order to improve the storage capacity, two storage capacitors may be formed on the upper and lower sides of the transistor 3, respectively, i.e., the process steps of forming the storage capacitors in examples 1 and 2 are combined.

Step S120: the light-emitting device 4 is formed.

Specifically, the anode 41, the light-emitting layer 42 and the cathode 43 of the light-emitting device 4 may be formed in sequence.

In some embodiments, as shown in FIGS. 1-3, the light-emitting device 4 may be connected directly to the transistor 3. In other embodiments, as shown in FIGS. 4-5, the light-emitting device 4 may be connected to the transistor 3 through the via electrode 45.

In summary, in this embodiment, the transistor 3 and the storage capacitor which are stacked can be formed on the transparent substrate 1. Since the transistor 3 and the storage capacitor are arranged in the thickness direction X of the display panel, it is possible to increase the area of the light-transmitting region B and improve the light transmittance of the display panel.

It should be noted that although the various steps of the method of the present disclosure are described in a particular order in the drawings, it is not required or implied that these steps must be performed in that particular order, or that all of the illustrated steps must be performed in order to achieve the desired results. Additionally, or alternatively, certain steps may be omitted, a plurality of steps may be merged into one step for execution, and/or a step may be decomposed into a plurality of steps for execution, etc. Further, some of the above steps may be executed in parallel or sequentially and the like, and are not limited to the specific sequence of operations described above.

Embodiment 5

This embodiment provides a display device, which may include a display panel described in the foregoing embodiments.

The specific type of the display device is not particularly limited. Types of display devices commonly used in the art can be used, such as OLED (Organic Light-Emitting Diode) display screens, mobile devices such as mobile phones, wearable devices such as watches, VR (Virtual Reality) devices, etc. Those skilled in the art can make corresponding choices according to the specific uses of the display devices, and will not repeat them here.

In the description of this description, illustrations of the reference terms "some embodiments", "exemplified", etc. mean that specific features, structures, materials, or features described in connection with the embodiment or example are included in at least one embodiment or example of the present disclosure. In this description, the schematic formulation of the above terms need not be directed to the same embodiments or examples. Further, the specific features, structures, materials or characteristics described may be combined in a suitable manner in any one or more embodiments or examples. Further, without contradicting one another, those skilled in the art may connect and combine different embodiments or examples described in this description and features of different embodiments or examples.

Although the embodiments of the present disclosure have been shown and described above, understandably, the above-described embodiments are exemplary and cannot be construed as limiting the present disclosure. Those of ordinary skill in the art may make changes, modifications, substitutions and modifications to the above-described embodiments within the scope of the present disclosure. Therefore, any changes or modifications made in accordance with the claims and descriptions of the present disclosure should fall within the scope of the present disclosure.

What is claimed is:

1. A display panel comprising:
   a transparent substrate having a light-emitting region and a light-transmitting region; and
   a transistor and at least one storage capacitor formed on the transparent substrate,
   wherein the transistor and the at least one storage capacitor are arranged in a thickness direction of the display panel,
   wherein the transistor and the at least one storage capacitor are formed on the light-emitting region without overlapping with the light-transmitting region;
   wherein the display panel further comprises a light-shielding layer formed between the transistor and the transparent substrate and shielding an active layer of the transistor;
   wherein the active layer of the transistor is located on a side of a gate of the transistor close to the light-shielding layer and is insulated from the light-shielding layer, wherein either of a source and a drain of the transistor penetrates an insulating layer between the source or the drain and the light-shielding layer and is connected to the light-shielding layer;
   wherein the at least one storage capacitor comprises:
     a first electrode plate constructed by the light-shielding layer;
     a second electrode plate located on a side of the first electrode plate away from the active layer; and
     a dielectric layer disposed between the second electrode plate and the first electrode plate.

2. The display panel according to claim 1, wherein the second electrode plate protrudes from an upper surface of the transparent substrate.

3. The display panel according to claim 1, wherein the second electrode plate is located in the transparent substrate, and an upper surface of the second electrode plate is flush with the upper surface of the transparent substrate; or
   the second electrode plate and the dielectric layer are located in the transparent substrate, and an upper surface of the dielectric layer is flush with the upper surface of the transparent substrate; or
   the first electrode plate, the second electrode plate, and the dielectric layer are located within the transparent substrate.

4. The display panel according to claim 1, wherein an area of the second electrode plate is larger than an area of the first electrode plate.

5. A manufacturing method of a display panel, comprising:
   providing a transparent substrate having a light-emitting region and a light-transmitting region; and
   forming a transistor and at least one storage capacitor on the transparent substrate;
   wherein the transistor and the at least one storage capacitor are arranged in a thickness direction of the display panel, and
   wherein the transistor and the at least one storage capacitor are formed on the light-emitting region without overlapping with the light-transmitting region;
   wherein forming the at least one storage capacitor comprises:
     forming a second electrode plate, a dielectric layer, and a light-shielding layer in sequence on the transparent substrate;
   wherein the light-shielding layer serves as a first electrode plate of the at least one storage capacitor;
   wherein the active layer of the transistor is located on a side of a gate of the transistor close to the light-shielding layer and is insulated from the light-shielding layer, wherein either of a source and a drain of the transistor penetrates an insulating layer between the source or the drain and the light-shielding layer and is connected to the light-shielding layer.

6. The manufacturing method of the display panel according to claim 5, wherein forming the second electrode plate, the dielectric layer, and the light-shielding layer in sequence on the transparent substrate comprises:
- removing a part of the transparent substrate to form a groove in the transparent substrate;
- forming the second electrode plate filling the groove, an upper surface of the second electrode plate being flush with an upper surface of the transparent substrate; and
- forming the dielectric layer and the light-shielding layer in sequence on the second electrode plate.

7. The manufacturing method of the display panel according to claim 5, wherein forming the second electrode plate, the dielectric layer, and the light-shielding layer in sequence on the transparent substrate comprises:
- removing a part of the transparent substrate to form a groove in the transparent substrate;
- forming the second electrode plate and the dielectric layer in sequence in the groove, an upper surface of the dielectric layer being flush with an upper surface of the transparent substrate; and
- forming the light-shielding layer on the dielectric layer.

8. The manufacturing method of the display panel according to claim 5, wherein the transistor is formed on the light-shielding layer after forming the at least one storage capacitor.

9. The manufacturing method of the display panel according to claim 5, wherein after forming the transistor and the at least one storage capacitor on the transparent substrate, the method further comprises:
- forming a light-emitting device.

\* \* \* \* \*